US006895565B2

(12) United States Patent
Parker

(10) Patent No.: US 6,895,565 B2
(45) Date of Patent: May 17, 2005

(54) METHODS FOR PREDICTING BOARD TEST COVERAGE

(75) Inventor: Kenneth P Parker, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 158 days.

(21) Appl. No.: 10/267,203

(22) Filed: Oct. 8, 2002

(65) Prior Publication Data

US 2004/0068702 A1 Apr. 8, 2004

(51) Int. Cl.$^7$ ............................................. G06F 17/50
(52) U.S. Cl. ................................. 716/4; 716/6; 716/18
(58) Field of Search ................... 716/1–6, 18; 702/179, 702/182, 117, 118; 714/30, 726; 707/3

(56) References Cited

U.S. PATENT DOCUMENTS

| | | | |
|---|---|---|---|
| 5,136,686 A | | 8/1992 | Koza |
| 5,271,090 A | | 12/1993 | Boser |
| 5,570,375 A | * | 10/1996 | Tsai et al. .................... 714/727 |
| 5,995,652 A | | 11/1999 | Chiu et al. |
| 6,091,846 A | | 7/2000 | Lin et al. |
| 6,167,390 A | | 12/2000 | Brady et al. |
| 6,279,146 B1 | * | 8/2001 | Evans et al. .................. 716/18 |
| 6,400,996 B1 | | 6/2002 | Hoffberg et al. |
| 2002/0170000 A1 | * | 11/2002 | Gorodetsky et al. .......... 714/30 |
| 2003/0018631 A1 | * | 1/2003 | Lipson et al. .................. 707/3 |
| 2003/0041286 A1 | * | 2/2003 | Boorom et al. ............... 714/30 |

OTHER PUBLICATIONS

Kenneth P. Parker, et al., "Methods and Apparatus for Characterizing Board Test Coverage", U.S. Appl. No. 10/233,767, 42 pages of specification including claims and abstract and five sheets of formal drawings (Figs. 1–11).

Kenneth P. Parker, et al., "Methods and Apparatus for Characterizing Board Test Coverage", U.S. Appl. No. 10/233,768, 49 pages of specification including claims and abstract and five sheets of formal drawings (Figs. 1–13).

K.P. Parker, "ITC 1996 Lecture Series on Unpowered Opens Testing," Proceeding, International Test Conference, 1996, p. 924.

E.O. Scholtzhauer and R.J. Balzer, "Real–World Board Test Effectiveness: What Does It Mean When the Board Passes?", Proceedings, International Test Conference, 1987, pp. 792–797.

M.V. Tegethoff, K.P Parker and K. Lee, "Opens Board Test Coverage: When is 99% Really 40%?", International Test Conference, Jun. 1996, pp. 333–339.

U.S. Patent Application of Kenneth P. Parker, et al., "Methods and Apparatus for Characterizing Board Test Coverage", U.S. Appl. No. 10/233,768 filed Sep. 1, 2002.

* cited by examiner

*Primary Examiner*—Vuthe Siek
*Assistant Examiner*—Binh Tat

(57) ABSTRACT

Disclosed are methods for predicting board test coverage. In one method, board test coverage is predicted by enumerating potentially defective properties for a board design; determining how each of a number of potential test technologies could be applied to the board design; and predicting board test coverage for one or more combinations of the potential test technologies. Board test coverage is predicted for a combination of potential test technologies by, for each potentially defective property enumerated, generating a property score that is indicative of whether a potential test technology could test for the potentially defective property; and combining property scores to predict board test coverage for the combination of potential test technologies.

28 Claims, 3 Drawing Sheets

Select one or more test options and click NEXT:

☐ Boundary-Scan
  ☐ Enable on IC 21
  ☐ Enable on IC 33
  ☐ Enable on IC 34
☐ TestJet
  ☐ Enable on IC 22
  ☐ Enable on IC 23
☐ AOI
  ☐ Ensure visibility of text on ICs
  ☐ Ensure visibility of pins on IC 33
  ☐ Ensure visibility of resistor 7

302

NEXT

METHODS FOR PREDICTING BOARD TEST COVERAGE

BACKGROUND OF THE INVENTION

A difficult problem faced by board designers is their need to make test-related design decisions before their board design is complete. This decision process is known as Design for Testability (DFT). The problem is difficult in that board designers are often not test experts and therefore have little or no understanding of how their boards are actually tested. Even for test experts, the large size and complexity of some boards make it difficult to see the effects of design tradeoffs with respect to testing. Unfortunately, once a design is complete, DFT changes may be difficult to justify in terms of re-design expense and/or the impact of any changes on a board's design schedule.

SUMMARY OF THE INVENTION

According to one exemplary embodiment of the invention, a method for predicting board test coverage comprises enumerating potentially defective properties for a board design; determining how each of a number of potential test technologies could be applied to the board design; and predicting board test coverage for one or more combinations of the potential test technologies. Board test coverage is predicted for a combination of potential test technologies by, for each potentially defective property enumerated, generating a property score that is indicative of whether a potential test technology could test for the potentially defective property; and combining property scores to predict board test coverage for the combination of potential test technologies.

According to another exemplary embodiment of the invention, a method for predicting board test coverage comprises enumerating potentially defective properties for a board design, and determining how each of a number of potential test technologies can be applied to the board design. The determination of how each potential test technology can be applied to the board design includes an enumeration of DFT features that enable the potential test technologies to test the board design. Thereafter, board test coverage is predicted for one or more combinations of the potential test technologies and enumerated DFT features. A prediction is made by, for each potentially defective property enumerated, generating a property score that is indicative of whether a potential test technology could test for the potentially defective property. Property scores are then combined to predict board test coverage for each combination of potential test technologies. For each board test coverage prediction and its corresponding combination of potential test technologies, a list of DFT features is compiled (with the DFT features being ones on which the board test coverage prediction is based).

BRIEF DESCRIPTION OF THE DRAWINGS

Illustrative and presently preferred embodiments of the invention are illustrated in the drawings in which:

FIG. 5 illustrates an exemplary graphical user interface through which a user could interact with the method of FIG. 4.

DESCRIPTION OF THE PREFERRED EMBODIMENT

New methods and apparatus for characterizing board test coverage were disclosed in the United States patent applications of Parker, et al. entitled "Methods and Apparatus for Characterizing Board Test Coverage" (Ser. No. 10/233,767 filed Sep. 3, 2002; and Ser. No. 10/233,768 filed Sep. 3, 2002). These applications are hereby incorporated by reference for all that they disclose.

The above-referenced applications were largely based on the assumptions that all of a board's design information was available, and that some number of tests had already been generated for the board. However, test-related design decisions must typically be made before a board's design is complete. It would therefore be desirable if some or all of the principles disclosed in the above-referenced patent applications could be used to predict board test coverage prior to the completion of a board's design. In this manner, a board designer could predict board test coverage for various combinations of test technologies and make intelligent tradeoff decisions on how to modify a board design to achieve a desired level of test coverage.

Definitions

Before describing methods and apparatus for characterizing board test coverage, some definitions will be provided.

The term "board" is used herein to designate any of a number of past, present or future types of circuit assemblies on which components are mounted or integrated, including printed circuit boards, Multi-Chip Modules, and Silicon-in-Package devices.

A "defective property" is any property that deviates unacceptably from a norm. Defective properties of a board include, but are not limited to:

An open solder joint.

A solder joint with insufficient, excess, or malformed solder (possibly with or without electrical manifestation).

A short caused by excess solder, bent pins, or device misregistration.

A dead device (e.g., an integrated circuit damaged by electrostatic discharge, or a cracked resistor).

A component that is incorrectly placed.

A missing component.

A polarized component that is rotated 180 degrees.

A misaligned component (typically laterally displaced).

Figure 1:
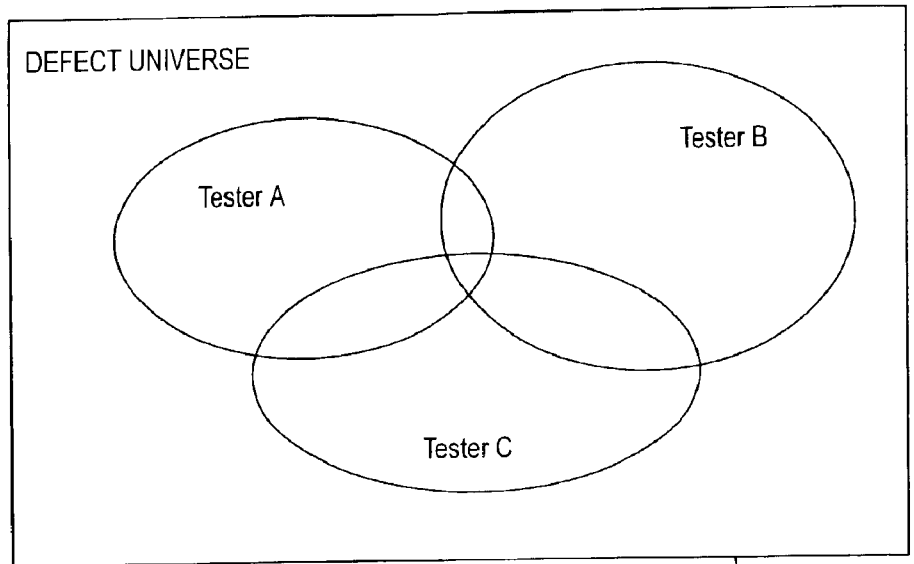
FIG. 1 illustrates a defect universe, and a VENN diagram of testers that cover the defect universe.

Together, the potentially defective properties for a board comprise a "defect universe". FIG. 1 illustrates such a defect universe 100, as well as a VENN diagram of various testers (Tester A, Tester B, and Tester C) that cover the defect universe 100. Although FIG. 1 illustrates a VENN diagram of testers, the potentially defective properties comprising a defect universe 100 can (and typically should) be enumerated without regard for how the potentially defective properties might be tested.

A board can be tested for a potentially defective property by executing a "test". A test, as defined herein, is an experiment of arbitrary complexity that will pass if the tested properties of a component (or set of components) and their associated connections are all acceptable. A test may fail if any tested property is not acceptable. A simple test might measure the value of a single resistor. A complex test might test thousands of connections among many components. A "test suite" is a test or combination of tests, the collection of which is designed to sufficiently test a board so that the board is likely to perform its intended function(s) in the field.

The tests of a test suite correspond to one or more "test technologies". Exemplary test technologies include, but are not limited to: In-Circuit test, Boundary-Scan test, TestJet test, Automated X-Ray Inspection (AXI), and Automated Optical Inspection (AOI).

A "board test coverage prediction" is a prediction of the quality of tests that can and might be generated for a board that is submitted to a combination of potential test technologies. Although a board test coverage prediction may be generated for a board whose design is complete, a board test coverage prediction may also be generated (and is preferably generated) for a board whose design is incomplete.

A First Exemplary Method for Predicting Board Test Coverage

Figure 2:
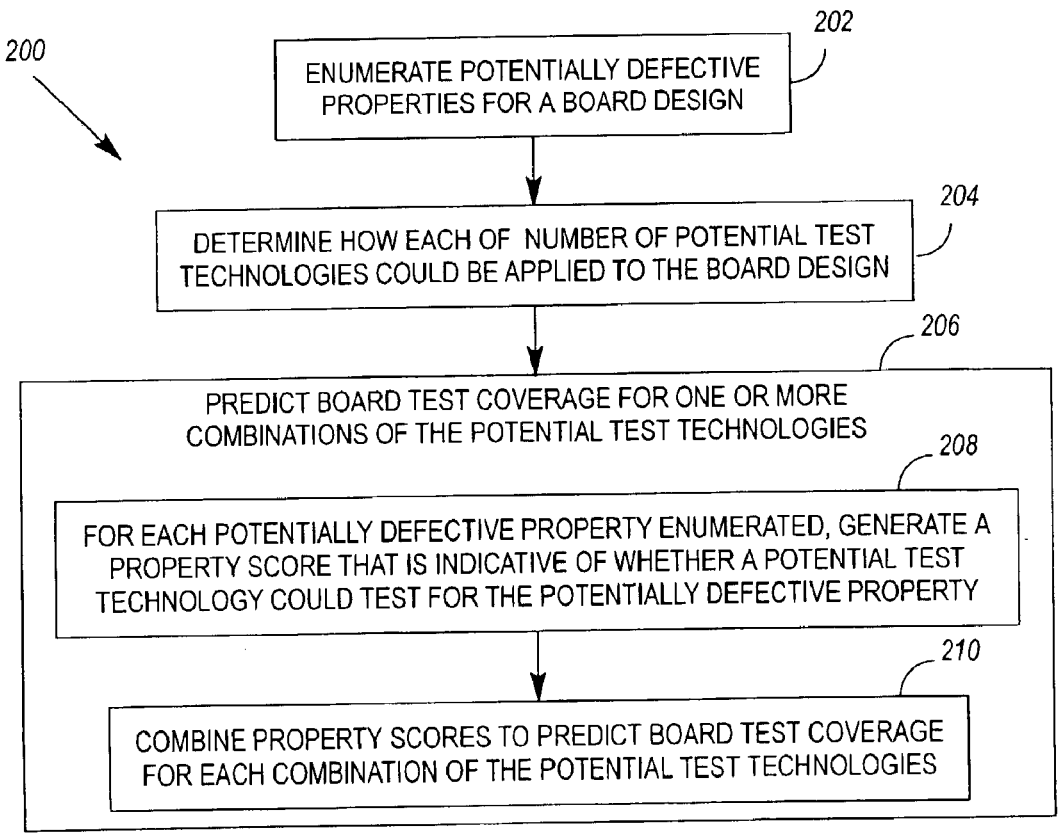
FIG. 2 illustrates a first exemplary method for predicting board test coverage.

As illustrated in FIG. 2, a first exemplary method 200 for predicting board test coverage comprises enumerating 202 potentially defective properties for a board design; determining 204 how each of a number of potential test technologies could be applied to the board design; and predicting 206 board test coverage for one or more combinations of the potential test technologies. Board test coverage is predicted for a combination of potential test technologies by, for each potentially defective property enumerated, generating 208 a property score that is indicative of whether a potential test technology could test for the potentially defective property; and combining 210 property scores to predict board test coverage for the combination of potential test technologies.

The potentially defective properties enumerated for a board design may include any or all of the potentially defective properties set forth in the patent applications of Parker, et al. that have been incorporated herein by reference. These properties include the properties of the PCOLA/SOQ model (i.e., the component properties of Presence, Correctness, Orientation, Liveness and Alignment (the PCOLA properties), and the connection properties of Short, Open and Quality (the SOQ properties)).

The board design from which potentially defective properties are enumerated may be embodied in logical and physical design data or, alternately, logical and no physical design data. Examples of logical design data include a netlist and a bill of materials. An example of physical design data is XY location data.

When a board design lacks some or all of its physical design data, the design is considered incomplete. A design may also be incomplete for want of complete logical design data. Effective enumeration of the PCOLA/SOQ properties is largely dependent on the completeness of a board's logical design data. Shorts are an exception in that their enumeration often depends on physical design data such as the XY location of pins and nets. It is possible, however, to enumerate a significant number of potential shorts based on logical indications of pin proximity. For example, a potential short could be enumerated for the pins of a two-terminal device. Potential shorts could also be enumerated for numerically adjacent pins of a component (e.g., potential shorts might be enumerated between pin 5 and either of pins 4 or 6, but not between pins 4 and 6). However, assumptions on pin proximity might sometimes be inaccurate. For example, pins 7 and 8 of a 14-pin dual-in-line package, although numerically adjacent, are located on opposite sides of the package and are thus non-adjacent. Yet, with the use of some simple heuristics, the locations of a great number of potential shorts can be estimated without any physical design data.

Figure 3:
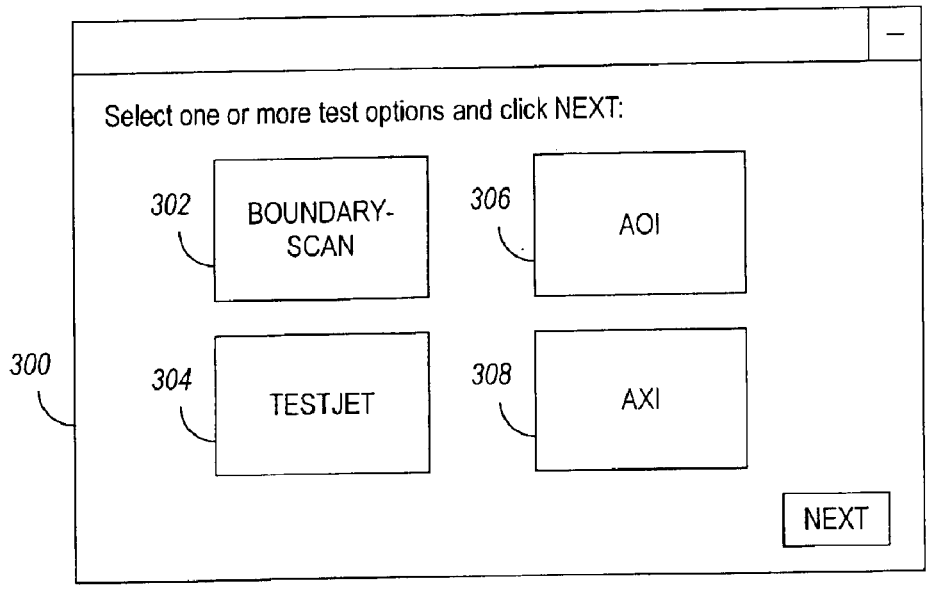
FIG. 3 illustrates an exemplary graphical user interface through which a user could interact with the method of FIG. 2.

FIG. 3 illustrates an exemplary graphical user interface (GUI, 300) for displaying test options 302, 304, 306, 308 to a user. As shown in FIG. 3, test options 302–308 may be based on the potential test technologies contemplated by the FIG. 2 method. In this manner, a user's selection of the test options 302–308 may determine the one or more combinations of potential test technologies for which board test coverage is predicted.

Property scores may be generated and combined as set forth in the patent applications of Parker, et al. that have been incorporated herein by reference. When generating property scores as disclosed in these other patent applications, Fully Tested, Partially Tested and Untested now refer to "predictions" as to whether a property will be Fully Tested, Partially Tested or Untested by a potential test technology. Separate property scores are preferably generated for each combination of potentially defective property and potential test technology. In this manner, it is easier to combine property scores for different combinations of potential test technologies, without having to first regenerate the individual property scores. As set forth in the prior patent applications of Parker, et al., property scores are preferably combined using a MAX function, wherein two Partially Tested predictions combine to yield a Partially Tested prediction (and not a Fully Tested prediction).

A Second Exemplary Method for Predicting Board Test Coverage

Figure 4:
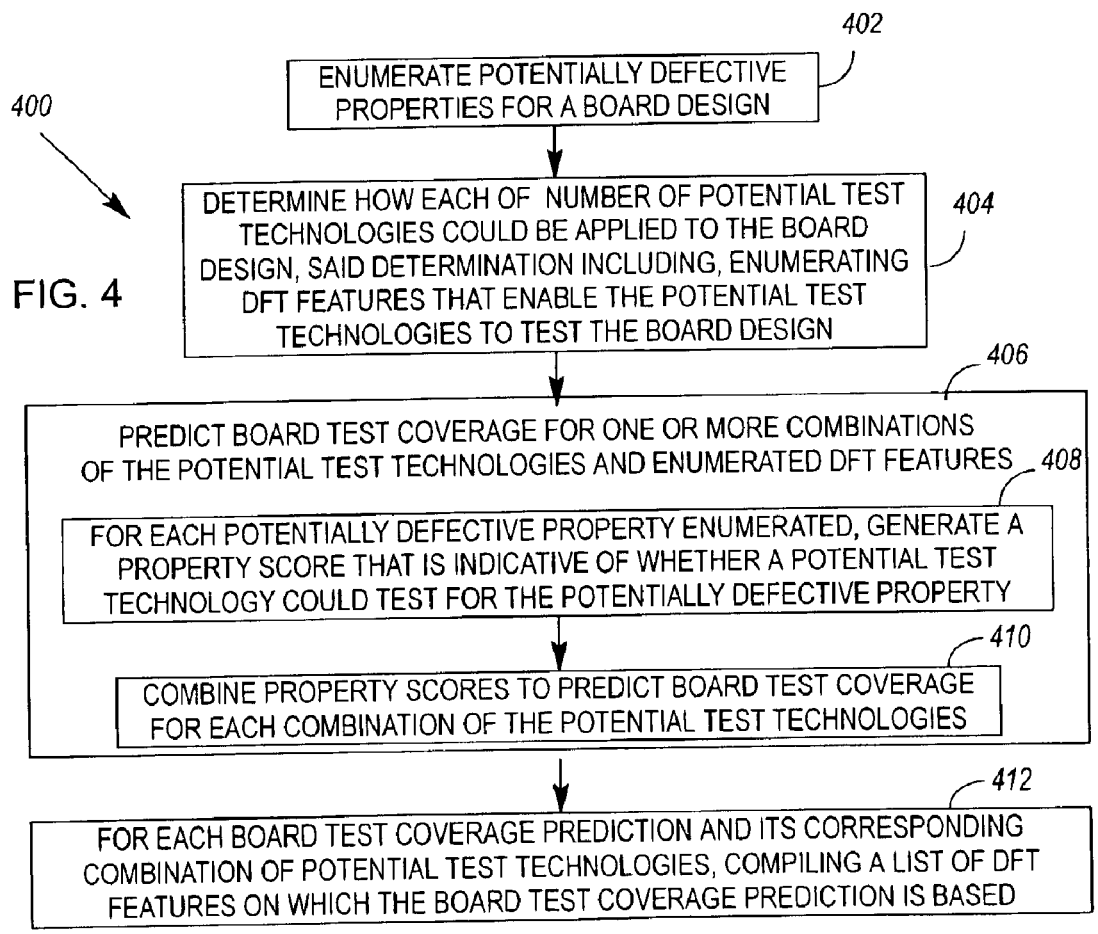
FIG. 4 illustrates a second exemplary method for predicting board test coverage.

FIG. 4 illustrates a second exemplary method 400 for predicting board test coverage. The method 400 comprises enumerating 402 potentially defective properties for a board design, and determining 404 how each of a number of potential test technologies can be applied to the board design. The determination of how each potential test technology can be applied to the board design includes an enumeration of DFT features that enable the potential test technologies to test the board design. Thereafter, board test coverage is predicted 406 for one or more combinations of the potential test technologies and enumerated DFT features. A prediction is made by, for each potentially defective property enumerated, generating 408 a property score that is indicative of whether a potential test technology could test for the potentially defective property. Property scores are then combined 410 to predict board test coverage for each combination of potential test technologies. For each board test coverage prediction and its corresponding combination of potential test technologies, a list of DFT features is compiled 412 (with the DFT features being ones on which the board test coverage prediction is based).

The method illustrated in FIG. 4 is similar to the method illustrated in FIG. 2, but for the enumeration of DFT features. In a preferred embodiment of the method, the enumerated DFT features are derived from existing features of the board design, as well as proposed modifications to the board design.

For example, if one of the potential test technologies is Boundary-Scan testing (conducted in accordance with IEEE Std. 1149.1), then DFT features that enable Boundary-Scan testing may comprise, but are not limited to: 1) the inclusion of an integrated circuit (IC) node in a Boundary-Scan chain, 2) the incorporation of a Test Access Port (TAP) into the design of an integrated circuit, and 3) a requirement that the TAP have probe access. If any of these features have already been incorporated into a board design, they may be enumerated as such. If not, ICs to which Boundary-Scan testing would be applicable and/or useful could be noted using a variety of heuristics, and then proposed modifications to the board design could be enumerated.

If one of the potential test technologies is TestJet testing, then a DFT feature that enables TestJet testing is probe access to a component's nodes. If probe access to a component's nodes has not been provided (either intentionally, or because a board's physical design data has yet to be generated), then probe access to a component's nodes can be enumerated as a proposed modification to a board design. Note that "modification" is used herein to reference "changes" to a board design, as well as "additions" to a board design. If TestJet testing of a board's components has yet to be considered, some simple heuristics may be used to identify board components that are good candidates for TestJet testing. For example, if a component is a digital IC with a dual-in-line package, the component is a good candidate for TestJet testing. An array-type IC is typically a poor candidate for TestJet testing (i.e., due to the minimal lead frame inside such components, and the likelihood that an internal ground plane would block the capacitive TestJet sensor). An IC's package type may be derived, for example, from the IC's pin naming convention.

If one of the potential test technologies is Automated Optical Inspection (AOI), then a DFT feature that enables AOI testing is optical visibility of one or more elements of the board design. Depending on the component or connection to be tested, optical visibility may be required for: an entire component, a registration notch of a component, a connection between two pins, a portion of a component to which screened text (e.g., a part number) should be applied, etc.

If a component found in a board design is deemed to have a higher failure rate than other components, then a DFT feature that might enable better testing of the component is probe access to the nodes of the component. Such probe access may make the component easier to test under a variety of test technologies (e.g., In-Circuit test, TestJet, etc.).

Although the combinations of test technologies for which board test coverage is predicted could be automatically determined, it will often be advantageous to convey potential test technologies to a user (e.g., displayed via a graphical user interface, output via an electronic file, etc.). In this manner, a user may be given the option of selecting his or her own desired combinations of the potential test technologies. Board test coverage may then be predicted for a combination of 1) the selected combination of potential test technologies, and 2) all of the enumerated DFT features that correspond to the selected combination of potential test technologies. Alternately, enumerated DFT features may be conveyed to a user in addition to the potential test technologies, thereby allowing a user to select from the potential test technologies and enumerated DFT features. In this manner, board test coverage may be predicted for a board design that incorporates only some of the DFT features that have been enumerated for a test technology.

FIG. 5 illustrates an exemplary graphical user interface (GUI, 500) for displaying test options 502 to a user. The test options 502 are based on potential test technologies and enumerated DFT features. When a user selects one or more test options 502, board test coverage is predicted for the selected test options.

Property Score Weighting

In any of the methods disclosed herein, property scores may be combined in accordance with a weighting structure. By way of example, the weighting structure may assign more weight to potentially defective properties that, if manifested in actual defects, are more critical to board operation. The weighting structure could also assign more weight to potentially defective properties that are more likely to present as actual defects. The weighting structure could also take other forms, as disclosed in the previously mentioned United States patent application of Parker, et al., Ser. No. 10/233,768.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for predicting board test coverage, comprising:
   a) enumerating potentially defective properties for a board design;
   b) determining how each of a number of potential test technologies could be applied to the board design; and
   c) predicting board test coverage for one or more combinations of the potential test technologies by:
      i) for each potentially defective property enumerated, generate a property score that is indicative of whether a potential test technology could test for the potentially defective property; and
      ii) combining property scores to predict board test coverage for each combination of potential test technologies.

2. The method of claim 1, wherein the board design is embodied in logical but no physical design data.

3. The method of claim 2, wherein the logical design data comprises a netlist and a bill of materials.

4. The method of claim 2, wherein at least some of the potentially defective properties are enumerated in accordance with a PCOLA/SOQ model.

5. The method of claim 2, wherein one potentially defective property is "short"; and wherein potential shorts are enumerated based on logical indications of pin proximity.

6. The method of claim 5, wherein a potential short is enumerated for the pins of a two-terminal device.

7. The method of claim 5, wherein a potential short is enumerated for numerically adjacent pins of a component.

8. The method of claim 1, further comprising displaying test options via a graphical user interface; wherein the test options are based on the potential test technologies; and wherein the one or more combinations of potential test technologies for which board test coverage is predicted are determined by a user's selection of the test options.

9. A method for predicting board test coverage, comprising:
   a) enumerating potentially defective properties for a board design;
   b) determining how each of a number of potential test technologies can be applied to the board design, said determination including, enumerating DFT features that enable the potential test technologies to test the board design;

c) predicting board test coverage for one or more combinations of the potential test technologies and enumerated DFT features by:

i) for each potentially defective property enumerated, generating a property score that is indicative of whether a potential test technology could test for the potentially defective property; and ii) combining property scores to predict board test coverage for each combination of potential test technologies; and d) for each board test coverage prediction and its corresponding combination of potential test technologies, compiling a list of DFT features on which the board test coverage prediction is based.

10. The method of claim 9, wherein the board design is embodied in logical but no physical design data.

11. The method of claim 10, wherein the logical design data comprises a netlist and a bill of materials.

12. The method of claim 10, wherein at least some of the potentially defective properties are enumerated in accordance with a PCOLA/SOQ model.

13. The method of claim 10, wherein one potentially defective property is "short"; and wherein potential shorts are enumerated based on logical indications of pin proximity.

14. The method of claim 13, wherein a potential short is enumerated for the pins of a two-terminal device.

15. The method of claim 13, wherein a potential short is enumerated for numerically adjacent pins of a component.

16. The method of claim 9, wherein the enumerated DFT features comprise proposed modifications to the board design.

17. The method of claim 9, wherein one of the potential test technologies is Boundary-Scan testing, and one of the DFT features that enables Boundary-Scan testing is inclusion of an IC node in a Boundary-Scan chain.

18. The method of claim 9, wherein one of the potential test technologies is Boundary-Scan testing, and two of the DFT features that enable Boundary-Scan testing are incorporation of Test Access Port (TAP) into the design of an integrated circuit, and probe access to the TAP.

19. The method of claim 9, wherein one of the potential test technologies is TestJet testing, and one of the DFT features that enables TestJet testing is probe access to a component's nodes.

20. The method of claim 9, wherein one of the potential test technologies is TestJet testing, and wherein determining how TestJet testing could be applied to the board design comprises determining an integrated circuit's package type, and then using the package type to determine whether the integrated circuit is a good candidate for TestJet testing.

21. The method of claim 9, wherein one of the DFT features is probe access to nodes of a component that is deemed to have a higher failure rate than other components.

22. The method of claim 9, wherein one of the DFT features is optical visibility of one or more elements of the board design.

23. The method of claim 9, further comprising:

a) conveying the potential test technologies to a user; and b) in response to the user selecting a combination of potential test technologies, predicting board test coverage for a combination of:

i) the selected combination of potential test technologies; and ii) all of the enumerated DFT features corresponding to the selected combination of potential test technologies.

24. The method of claim 9, further comprising:

a) conveying the potential test technologies and enumerated DFT features to a user; and b) in response to the user selecting a combination of the potential test technologies and enumerated DFT features, predicting board test coverage for the combination.

25. The method of claim 9, further comprising displaying test options via a graphical user interface; wherein the test options are based on the potential test technologies and/or the enumerated DFT features; and wherein board test coverage is predicted for one or more user selected test options.

26. The method of claim 9, wherein property scores are combined in accordance with a weighting structure.

27. The method of claim 26, wherein the weighting structure assigns more weight to potentially defective properties that, if manifested in actual defects, are more critical to board operation.

28. The method of claim 26, wherein the weighting structure assigns more weight to potentially defective properties that are more likely to present as actual defects.

* * * * *

UNITED STATES PATENT AND TRADEMARK OFFICE
CERTIFICATE OF CORRECTION

PATENT NO. : 6,895,565 B2
APPLICATION NO. : 10/267203
DATED : May 17, 2005
INVENTOR(S) : Parker Page 1 of 1

It is certified that error appears in the above-identified patent and that said Letters Patent is hereby corrected as shown below:

On the face page, in field (56), under "Other Publications", in column 1, line 3, insert --Atty. Docket No. 10020992-1, -- before "42".

On the face page, in field (56), under "Other Publications", in column 2, line 4, insert -- Atty. Docket No. 10020991-1, -- before "49".

On the face page, in field (56), under "Other Publications", in column 2, line 5, delete "five" and insert -- six --, therefor.

On the face page, in field (56), under "Other Publications", in column 2, line 9, delete "Scholtzhauer" and insert -- Schlotzhauer --, therefor.

Signed and Sealed this

Fourteenth Day of November, 2006

JON W. DUDAS
*Director of the United States Patent and Trademark Office*